under 35 U.S.C. 154(b) by 302 days.

(12) United States Patent
Han et al.

(10) Patent No.: US 9,113,545 B2
(45) Date of Patent: Aug. 18, 2015

(54) TAPE WIRING SUBSTRATE AND CHIP-ON-FILM PACKAGE INCLUDING THE SAME

(75) Inventors: Sang-uk Han, Gyeonggi-do (KR); Young-shin Kwon, Gyeonggi-do (KR); Kwan-jai Lee, Gyeonggi-do (KR); Jae-min Jung, Seoul (KR); Kyong-soon Cho, Gyeonggi-do (KR); Jeong-kyu Ha, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 13/604,412

(22) Filed: Sep. 5, 2012

(65) Prior Publication Data
US 2013/0148312 A1    Jun. 13, 2013

(30) Foreign Application Priority Data
Dec. 20, 2011    (KR) .................. 10-2011-0138490

(51) Int. Cl.
  H05K 1/00    (2006.01)
  H05K 7/00    (2006.01)
  H05K 1/02    (2006.01)
  H05K 3/32    (2006.01)
  H05K 1/14    (2006.01)
  H05K 1/18    (2006.01)

(52) U.S. Cl.
  CPC .................. *H05K 7/00* (2013.01); *H05K 1/028* (2013.01); *H05K 1/147* (2013.01); *H05K 1/189* (2013.01); *H05K 3/323* (2013.01); *H05K 2201/09036* (2013.01); *H05K 2201/10128* (2013.01)

(58) Field of Classification Search
  USPC ........................... 361/749, 736, 748; 438/106
  See application file for complete search history.

(56) References Cited

U.S. PATENT DOCUMENTS

2004/0219713 A1*  11/2004  Lee ................................ 438/106
2006/0156543 A1*   7/2006  Hirano ............................ 29/857

FOREIGN PATENT DOCUMENTS

| JP | 2003-243778 | 8/2003 |
| JP | 2005-183836 | 7/2005 |
| KR | 10-2008-0060615 | 7/2008 |

OTHER PUBLICATIONS

English Abstract for Publication No. 2005-183836.
English Abstract for Publication No. 10-2008-0060615.
English Abstract for Publication No. 2003-243778.

* cited by examiner

*Primary Examiner* — Andargie M Aychillhum
(74) *Attorney, Agent, or Firm* — F. Chau & Associates, LLC

(57) ABSTRACT

A tape wiring substrate includes a base film having at least one recess in a first surface of the base film and a chip-mounting region on which a semiconductor chip is included on a second surface of the base film. A wiring pattern is formed on the second surface of the base film and is extended to an edge of the chip-mounting region. A protection film covers the wiring pattern.

16 Claims, 7 Drawing Sheets

TAPE WIRING SUBSTRATE AND CHIP-ON-FILM PACKAGE INCLUDING THE SAME

CROSS-REFERENCE TO RELATED APPLICATIONS

This application claims the benefit of Korean Patent Application No. 10-2011-0138490, filed on Dec. 20, 2011, in the Korean Intellectual Property Office, the disclosure of which is incorporated herein in its entirety by reference.

TECHNICAL FIELD

The inventive concept relates to tape wiring substrates and more particularly, to tape wiring substrates and chip-on-film packages including the tape wiring substrates.

DISCUSSION OF THE RELATED ART

Liquid crystal display (LCD) devices and organic light-emitting diode (OLED) devices are commonly used as displays for mobile phones and computers as they are thin and lightweight. Both LCD devices and OLED devices utilize a driving integrated circuit chip ("drive IC") that is responsible for providing the driving signals to the display device. The drive IC may be enclosed within a tape package. The tape package for the drive IC should also be thin and lightweight to avoid adding additional bulk to the display device.

The tape package is a semiconductor package that uses a tape wiring substrate. There are two different types of tape packages. One type of tape package is a tape carrier package and the other type is a chip-on-film package. The tape carrier package has a structure in which a semiconductor chip is mounted on an inner lead exposed on a window of a tape wiring substrate. The chip-on-film package has a structure in which a semiconductor chip is mounted using a flip chip bonding method on a tape wiring substrate. The tape wiring substrate of the chip-on-film package does not have a window.

SUMMARY

The inventive concept provides a reliable tape wiring substrate that may be used for a tape packages.

The inventive concept also provides a chip-on-film package including the tape wiring substrate.

According to an aspect of the inventive concept, there is provided a tape wiring substrate including a base film having at least one recess in a first surface thereof and a chip-mounting region on which a semiconductor chip is included on a second surface thereof. A wiring pattern is formed on the second surface of the base film and is extended to an edge of the chip-mounting region. A protection film covers the wiring pattern.

The base film may either have a single recess or multiple recesses. Where multiple recesses are formed, each recess may have substantially the same width or some recesses may have diriment widths. The recesses may be separated from each other by a single predetermined distance or the recesses may be separated from each other by different distances. The recesses may have different depths.

Where the base film has only a single recess, and the recess may have a width substantially greater than its depth.

The wiring patter may include an input wiring pattern and an output wiring pattern. An end of the input wiring pattern may be extended to an edge of the chip-mounting region. The other end of the input wiring pattern may be extended to an end of the base film. An end of the output wiring pattern may be extended to an edge of the chip-mounting region and the other end of the output wiring pattern may be extended to the other end of the base film.

According to an aspect of the inventive concept, there is provided a chip-on-film package including a tape wiring substrate that includes a base film having at least one recess in a first surface thereof and a chip-mounting region on which a semiconductor chip is included on a second surface thereof. A wiring pattern that is formed on the second surface of the base film is extended to an edge of the chip-mounting region. The wiring pattern comprises an input wiring pattern and an output wiring pattern. A protection film covers the wiring pattern. A semiconductor chip is connected to the input wiring pattern and the output wiring pattern through electrode bumps formed on edges of an active surface. The semiconductor chip is mounted on the chip-mounting region. The input wiring pattern is connected to a printed circuit board and the output wiring pattern is connected to a display panel.

The base film may be bent with the recess in an inner or outer side of the base film. An end of the output wiring pattern may be connected to an upper surface of the display panel. The end of the output wiring pattern may be connected to the upper surface of the display panel through a via that penetrates the base film.

The chip-on-film package may further include a flexible printed circuit (FPC) film and a second wiring formed on the FPC film. An end of the second wiring may be connected to the input wiring pattern and the other end of the second wiring is connected to the printed circuit board.

The base film may include a plurality of recesses formed by a polyimide etching process or a laser process.

The output wiring pattern may be connected to a flexible panel of an organic light-emitting display device or a liquid crystal display device.

A display device includes a display panel and a flexible tape wiring substrate having one or more recesses formed thereon. The flexible tape wiring substrate is connected to a top surface of the display panel. A semiconductor chip is mounted on the flexible tape wiring substrate. The flexible tape wiring substrate is bent such that the semiconductor chip mounted thereon is positioned underneath a bottom surface of the display panel.

The flexible tape wiring substrate may include a base film, a wiring pattern formed over the base film, and a protective film formed over the wiring pattern.

The one or more recesses may include a plurality of recesses of identical widths and identical spacing, of identical widths and varying spacing, of varying widths and identical spacing, or of varying widths and varying spacing.

Alternatively, the one or more recesses may include only a single recess having a width that is substantially greater than its depth.

The semiconductor chip may include a display driver for driving the display panel.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
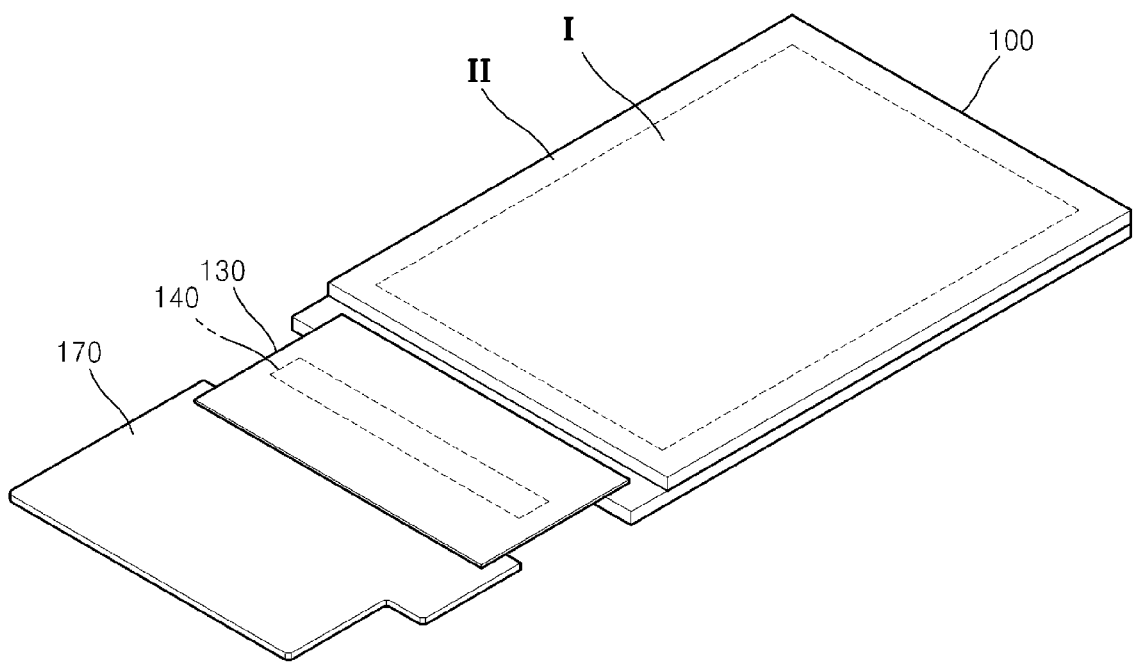
FIG. 1 is a perspective view of a display module according to an exemplary embodiment of the inventive concept.

The inventive concept will now be described more fully with reference to the accompanying drawings in which exemplary embodiments of the inventive concept are shown.

This inventive concept may, however, be embodied in many different forms and should not construed as limited to the exemplary embodiments set forth herein. In the drawings, thicknesses and sizes of layers may be exaggerated for convenience of explanation and clarity. Like numbers may refer to like elements throughout the description of the figures.

FIG. 1 is a perspective view of a display module according to an embodiment of the inventive concept.

Referring to FIG. 1, the display module includes a display panel 100, a printed circuit board 170, and a chip-on-film package.

The display panel 100 may be a liquid crystal display (LCD) panel or an organic light-emitting display (OLED) panel. The display panel 100 may include a display region I that displays an image and a peripheral region II that applies a driving signal to the display region I. The display panel 100 may include an upper panel, a lower panel, and an organic light-emitting structure or a liquid crystal structure, a plurality of gate lines (not shown), and a plurality of data lines (not shown) formed between the upper panel and the lower panel. Each of the upper and lower panels may include a glass substrate, a quartz substrate, or a transparent plastic substrate. When the display panel 100 includes a transparent plastic substrate, the display panel 100 may be a flexible substrate.

At least one chip-on-film package may be attached to a long side and a short side of the display panel 100. In an exemplary embodiment, chip-on-film packages attached to the long side of the display panel 100 may be driving packages that include a data driving voltage circuit. The chip-on-film packages attached to the short side of the display panel 100 may be driving packages that include a scan driving voltage circuit. The chip-on-film packages may respectively include a tape wiring substrate 130 and an integrated circuit (IC), which may be referred to herein as a semiconductor chip 140.

The chip-on-film packages are attached to the printed circuit board 170. The chip-on-film packages may apply data voltages to the display panel 100 in response to image data and various control signals received from the printed circuit board 170.

In FIG. 1, the printed circuit board 170 is connected to the short side of the display panel 100. However, the printed circuit board 170 may alternatively be attached to the long side of the display panel 100. If the printed circuit board 170 is not attached to the long side of the display panel 100, a scan driving signal may be supplied from the printed circuit board 170 connected to the short side of the display panel 100.

Figure 2:
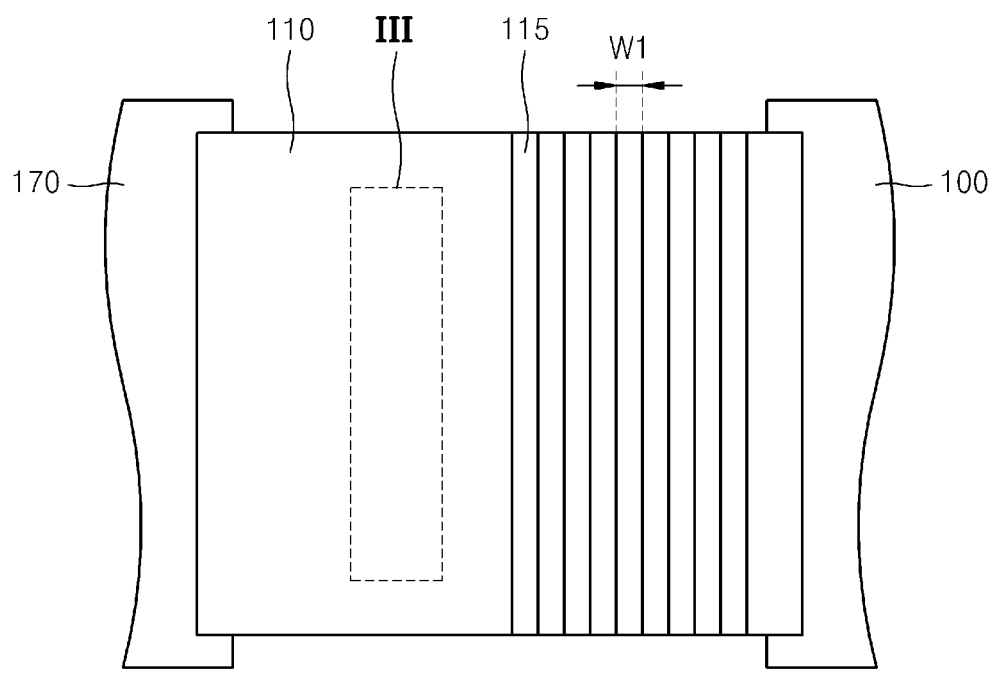
FIG. 2 is a plane view of a chip-on-film package according to an exemplary embodiment of the inventive concept.
Figure 3:
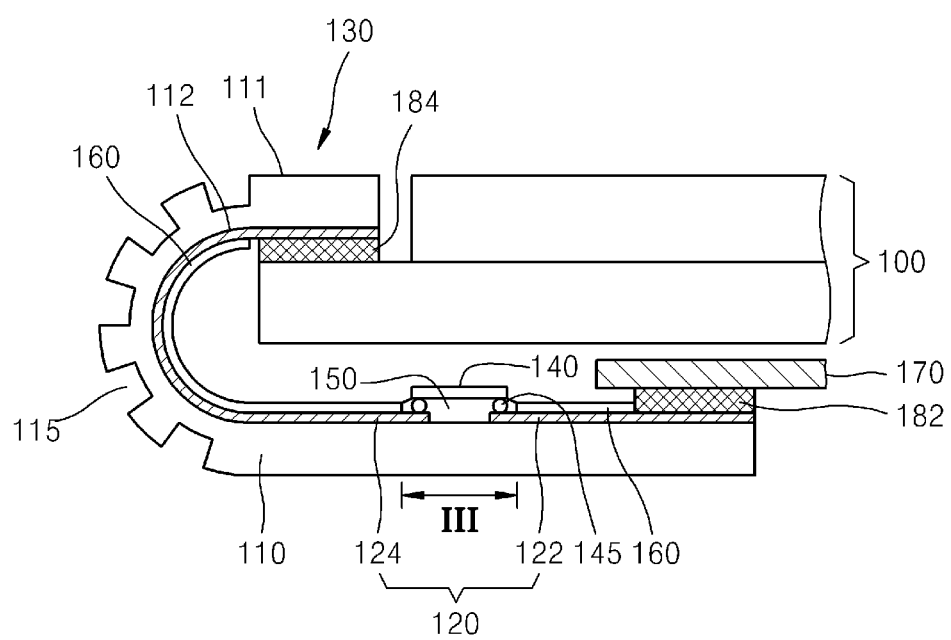
FIG. 3 is a cross-sectional view of the bent chip-on-film package of FIG. 2.

FIG. 2 is a plane view of a chip-on-film package according to an embodiment of the inventive concept and FIG. 3 is a cross-sectional view of the bent chip-on-film package of FIG. 2.

Referring to FIGS. 2 and 3, the chip-on-film package may include the tape wiring substrate 130 and the semiconductor chip 140. The semiconductor chip 140 may be mounted on a chip-mounting region III.

The tape wiring substrate 130 may include a base film 110, a wiring pattern 120, and a protection film 160.

The base film 110 may be flexible, may have insulating properties, and may be formed of, for example, a resin film, such as polyimide. The base film 110 may have an upper surface 111 and a lower surface 112. A surface of the base film 110 that contacts the display panel 100 is the lower surface 112 and the other surface of the base film 110 is the upper surface 111.

A plurality of recesses 115 is formed in the upper surface 111 of the base film 110. The recesses 115 may be substantially parallel to an edge of the base film 110 and may be attached to the display panel 100. The recesses 115 may be formed apart from each other at predetermined intervals. Each of the recesses 115 may have a first width W1. A cross-section of the recesses 115 may have various shapes, for example, a rectangular shape, a rounded rectangular shape, a half circular shape, or an oval shape. In an exemplary embodiment, the recesses 115 may be formed in the upper surface 111 of the base film 110 by a polyimide etching process, such as a mechanical processing process, a laser processing process, or a chemical etching process.

The wiring pattern 120 may be formed on the lower surface 112 of the base film 110 and may include an input wiring pattern 122 and an output wiring pattern 124. An end of the input wiring pattern 122 may be connected to the printed circuit board 170 and the other end of the input wiring pattern 122 may be extended to an edge of the chip-mounting region III. An end of the output wiring pattern 124 may be connected to a gate line or a data line formed on the display panel 100 and the other end may be extended to an edge of the chip-mounting region III. The wiring pattern 120 may be formed of a conductive material, such as Cu, Al, or Ti. The wiring pattern 120 may transfer a data driving voltage or a scan driving voltage to the display panel 100 from the printed circuit board 170.

The protection film 160 may cover the wiring pattern 120 on the lower surface 112 of the base film 110. The protection film 160 need not be formed on both edges of the base film 110, and thus, may expose both edges of the wiring pattern 120. In an exemplary embodiment, the protection film 160 may be formed of a resin, such as polyimide. The protection film may be flexible.

The semiconductor chip 140 may be included in the chip-mounting region III that is formed on the lower surface 112 of the base film 110. The semiconductor chip 140 may be connected to the input wiring pattern 122 and the output wiring pattern 124 at edges of the chip-mounting region III through an electrode bump 145 formed around edges of an active surface. An underfill 150 may be filled in a space between the base film 110 and the semiconductor chip 140. The underfill 150 may include a solder resist.

The chip-on-film package may be connected to the printed circuit board 170 through a first connection unit 182, and may be connected to the display panel 100 through a second connection unit 184. The first connection unit 182 may connect a first wiring (not shown) formed on the printed circuit board 170 to the input wiring pattern 122 formed on the base film 110. The second connection unit 184 may connect a gate line or a data line formed on the display panel 100 to the output wiring pattern 124 formed on the base film 110. In an exemplary embodiment, the first connection unit 182 and the second connection unit 184 may be formed by hot-pressing the wiring pattern 120 that is not covered by the protection film 160 with respect to the first wiring pattern and the gate line or the data line by using an anisotropic conductive film. According to an embodiment, the first connection unit 182 and the second connection unit 184 may be formed by pressing the wiring pattern 120 with respect to the first wiring pattern and the gate line or the data line respectively by using a hot-pressing paste-type adhesive or a hot-pressing tape-type adhesive.

The chip-on-film package connected to the printed circuit board 170 and the display panel 100 may be bent in a direction parallel to an edge of the display panel 100 by exploiting the flexibility of the base film 110. Accordingly, the printed circuit board 170 and the semiconductor chip 140 on the chip-on-film package may be positioned on a lower side of the display panel 100. Generally, when the base film 110 having a given thickness is bent, stress may occur in the wiring pattern 120 due to a repulsion force for the base film 110 to return to an original flat shape, and thus, it may not be easy to bend the base film 110. Also, when the display panel 100 includes a flexible substrate, the connection strength between the display panel 100 and the wiring pattern 120 may be reduced or the connection therebetween may fail.

According to an exemplary embodiment, since the recesses 115 are formed in the upper surface 111 of the base film 110, the base film 110 may be bent so that the recesses 115 are in an outer side of the base film 110. A portion of the base film 110 in which the recesses 115 are formed has a small thickness, and thus, the repulsion force for the base film 110 to return to an original flat shape may be weak. Accordingly, stress that may occur in the wiring pattern 120 may be distributed, and thus, damage to the wiring pattern 120 may be prevented. Also, the reduction of connection strength at the second connection unit 184 may be prevented, thereby increasing the reliability of the chip-on-film package. Also, the base film 110 in which the recesses 115 are formed may have a small radius of curvature and may be readily bent. Therefore, manufacturing of a thin display device that uses the above display module may be simplified.

Figure 4:
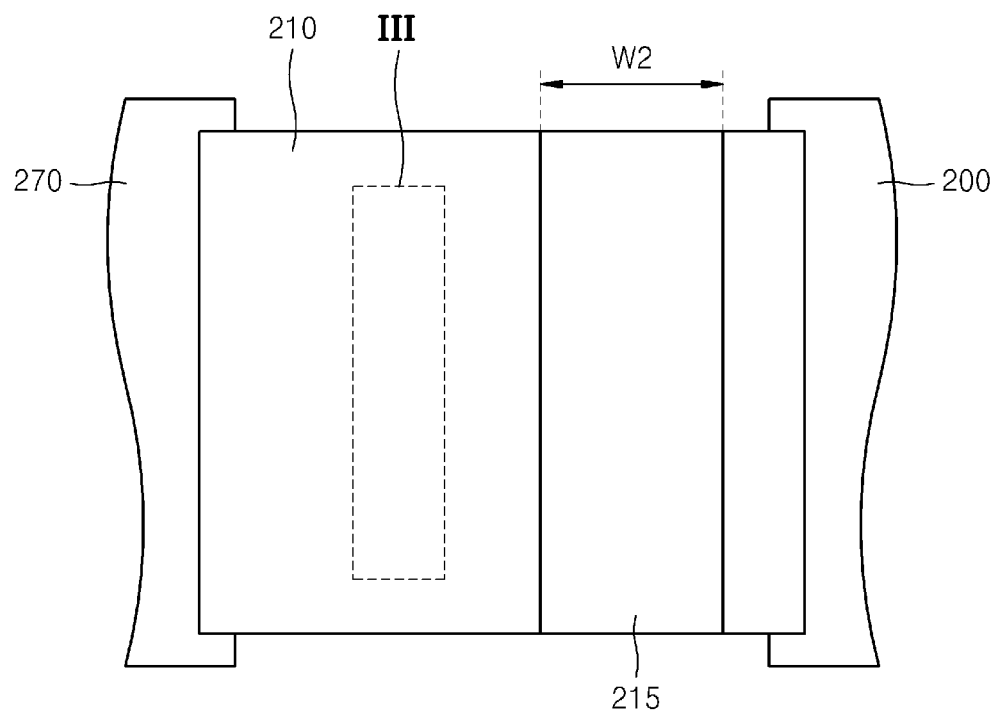
FIG. 4 is a plane view of a chip-on-film package according to an exemplary embodiment of the inventive concept.
Figure 5:
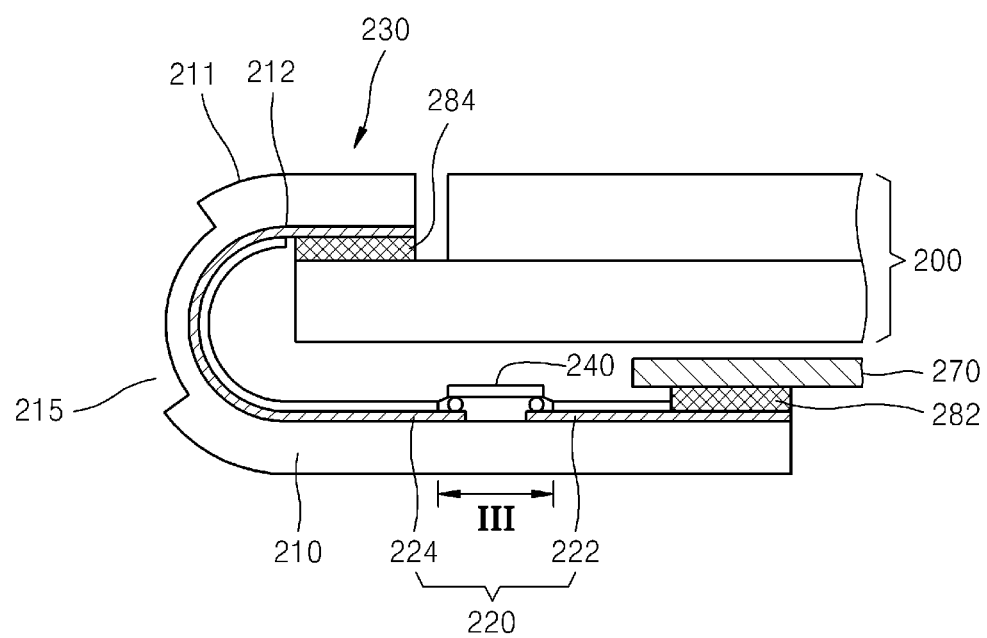
FIG. 5 is a cross-sectional view of the bent chip-on-film package of FIG. 4.

FIG. 4 is a plane view of a chip-on-film package according to an embodiment of the inventive concept, and FIG. 5 is a cross-sectional view of the bent chip-on-film package of FIG. 4. The chip-on-film package is substantially similar to the chip-on-film package described above with reference to FIGS. 2 and 3 except for the shape of a recess 215 formed in a tape wiring substrate 230. Accordingly, only differences between the two configurations are described and it may be assumed that features not described with reference to FIGS. 4 and 5 are substantially similar to corresponding features discussed above with respect to FIGS. 2 and 3.

Referring to FIGS. 4 and 5, a base film 210 may have the recess 215 in an upper surface 211 of the base film 210 and a wiring pattern 220 on a lower surface 212 of the base film 210. A semiconductor chip 240 may be formed in a chip-mounting region III formed on the lower surface 212 of the base film 210. An input wiring pattern 222 on the base film 210 may be connected to a printed circuit board 270 through a first connection unit 282, and an output wiring pattern 224 on the base film 210 may be connected to a display panel 200 through a second connection unit 284.

The recess 215 is formed in the upper surface 211 of the base film 210 and may have a second width W2. The second width W2 of the recess 215 may be larger than the depth of the recess 215. The second width W2 of the recess 215 may be formed to correspond to a length of a bending portion of the base film 210.

The base film 210 is bent with the recess 215 being in an outer side of the base film 210. Repulsion force for the base film 210 that may act to return the base film 210 to an original flat shape may be reduced, and thus, stress that may occur in the base film 210 may be distributed. Accordingly, the reduction of connection strength of the second connection unit 284 and wire disconnection may be reduced or prevented. Also, the base film 210 in which the recess 215 is formed may have a small radius of curvature and may be easily bent. Therefore, the manufacture of a thin display device that uses the above display module may be simplified.

Figure 6:
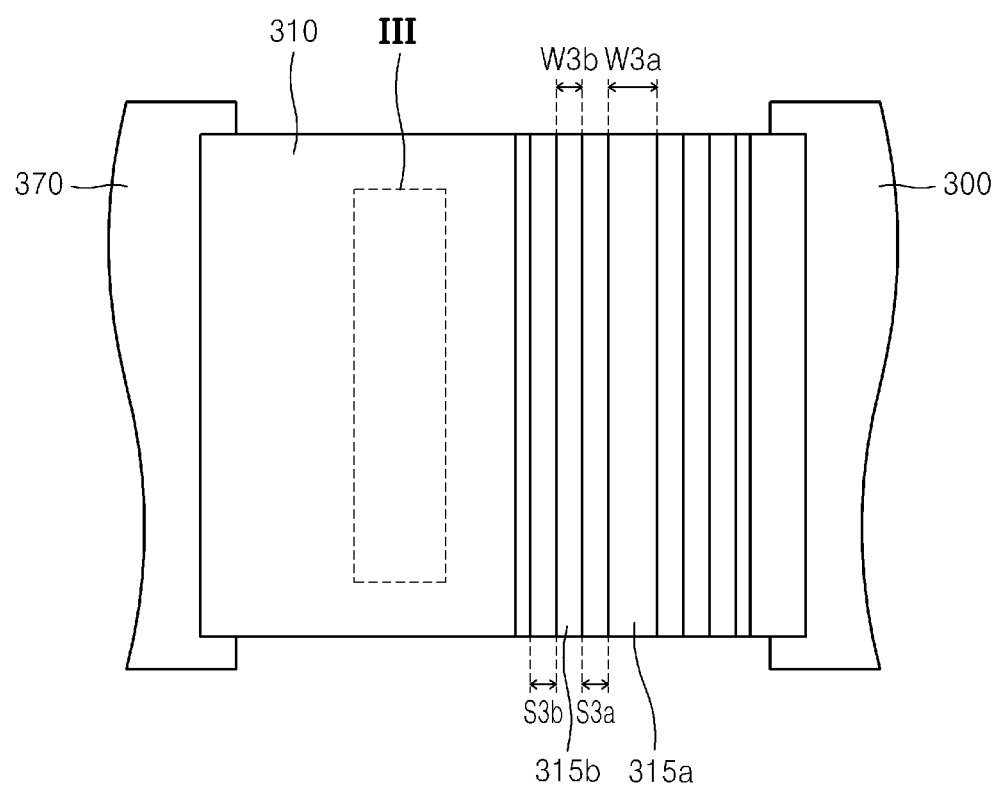
FIG. 6 is a plane view of a chip-on-film package according to an exemplary embodiment of the inventive concept.
Figure 7:
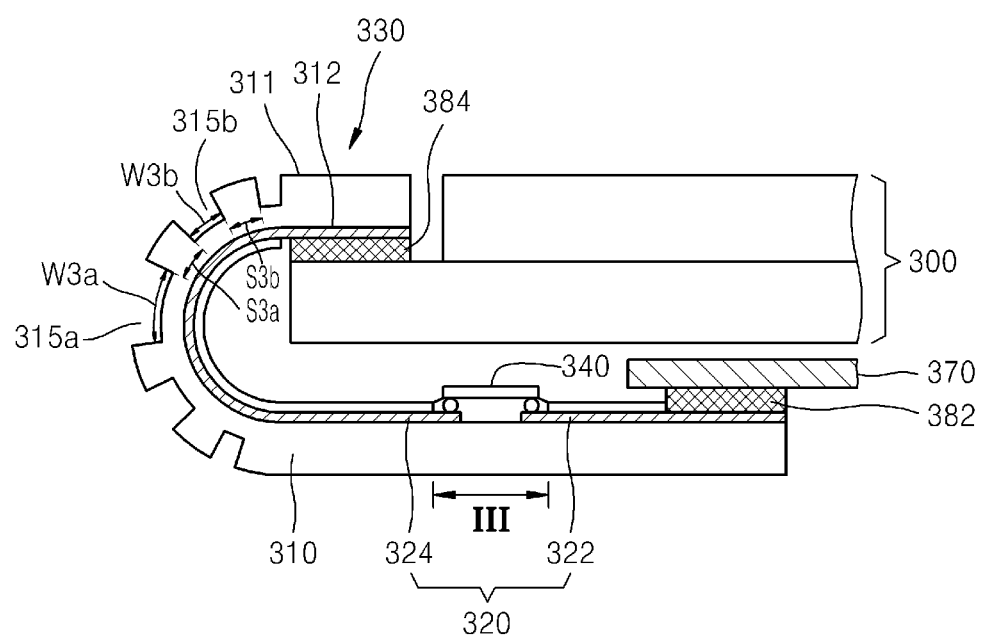
FIG. 7 is a cross-sectional view of the bent chip-on-film package of FIG. 6.

FIG. 6 is a plane view of a chip-on-film package according to an embodiment of the inventive concept, and FIG. 7 is a cross-sectional view of the bent chip-on-film package of FIG. 6. The chip-on-film package described with respect to FIGS. 6 and 7 may be substantially similar to the chip-on-film package described above with reference to FIGS. 2 and 3 except the shape of a plurality of recesses 315a and 315b formed in a tape wiring substrate 330, and thus, the description of FIGS. 6 and 7 may be limited to differences and it may be assumed that features not described are similar or identical to those described above with reference to FIGS. 2 and 3.

Referring to FIGS. 6 and 7, a base film 310 may include the recesses 315a and 315b in an upper surface 311 of the base film 310 and a wiring pattern 320 on a lower surface 312 of the base film 310. A semiconductor chip 340 may be formed in a chip-mounting region III formed on the lower surface 312 of the base film 310. An input wiring pattern 322 on the base film 310 may be connected to a printed circuit board 370 through a first connection unit 382, and an output wiring pattern 324 on the base film 310 may be connected to a display panel 300 through a second connection unit 384.

The recesses 315a and 315b are formed in the upper surface 311 of the base film 310. The recesses 315a and 315b have a predetermined width in a direction parallel to an edge of the display panel 300 and may be separated by a predetermined distance. The width and gaps of the recesses 315 may vary according to the density of a wiring pattern and the degree of bending of a wiring substrate. Each of the recesses 315a and 315b may be formed having different widths. For example, a central recess 315a may have a third width W3a, and recesses 315b formed on left side and right side of the central recess 315a may have a fourth width W3b that is smaller than the third width W3a. If the central recess 315a is formed having a larger width than those of adjacent recesses, e.g., left side and right side of the central recess 315b, the base film 310 on which the central recess 315a is formed has a further smaller radius of curvature and may be more easily bent.

Figure 8:
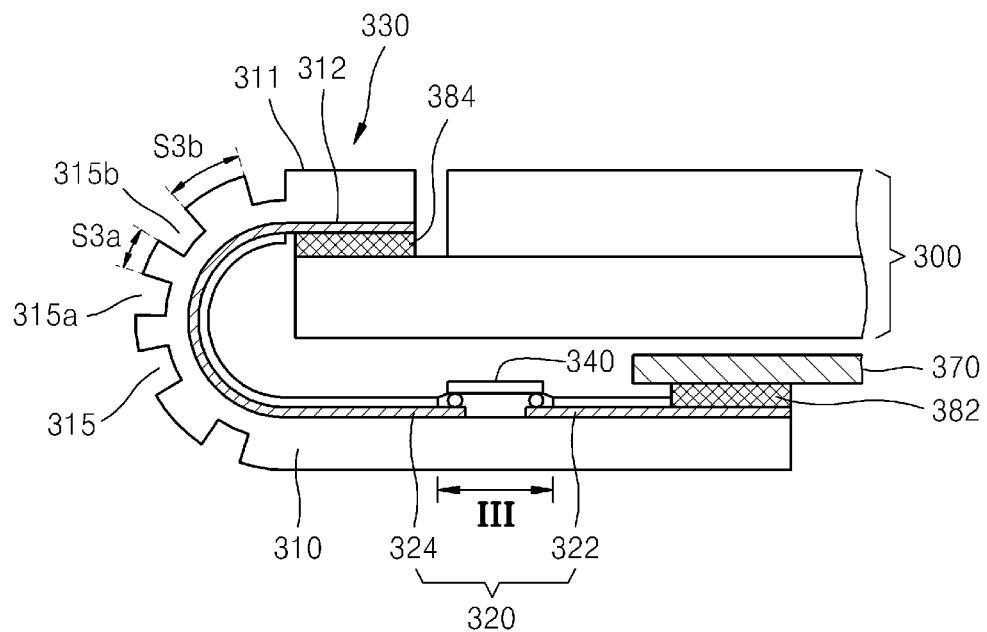
FIG. 8 is a cross-sectional view of a bent chip-on-film package according to an exemplary embodiment of the inventive concept.

FIG. 8 is a cross-sectional view of a bent chip-on-film package according to an exemplary embodiment of the inventive concept. In FIG. 8, a magnified shape of the recesses 315 is shown, and like reference numerals may be used to describe components that are similar to or identical to components described above with respect to FIG. 7.

Referring to FIG. 8, a plurality of recesses 315 may be formed having the same width, and may be separated by different distances. For example, a width of the central recess 315a may be formed substantially the same as a width of the recesses 315b formed on left and right sides of the central recess 315a. For example, a first space S3a may be different from a second space S3b. For example, the recesses 315 may have separation distances gradually increasing from the central recess 315a towards both edges of the base film 310.

Figure 9:
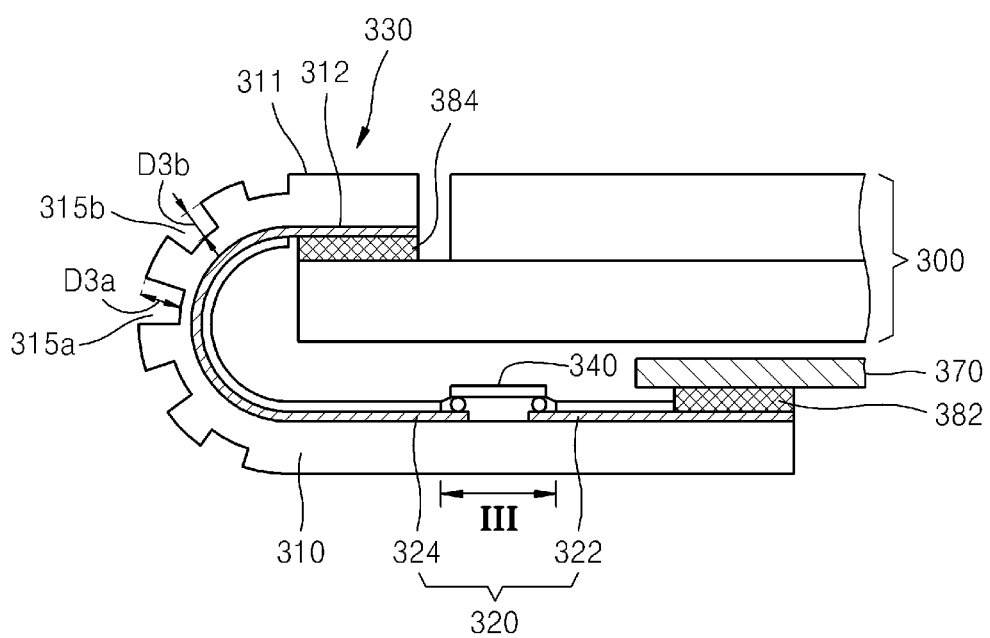
FIG. 9 is a cross-sectional view of a bent chip-on-film package according to an exemplary embodiment of the inventive concept.

FIG. 9 is a cross-sectional view of a bent chip-on-film package according to an exemplary embodiment of the inventive concept. In FIG. 9, the shape of the recesses 315 are magnified and like reference numerals may be used to describe components that are similar to or identical to components described above with respect to FIG. 7.

Referring to FIG. 9, the recesses 315a and 315b have the same width, and the depths of the recesses 315a and 315b gradually reduce in left and right directions from the central recess 315a. For example, the central recess 315a may have a first depth D3a that is greater than a second depth D3b of the recesses 315b formed on both left and right sides of the central recess 315a. As the depth of the recess 315 increases, the thickness of the base film 310 where the recess 315 is formed decreases. Therefore, the base film 310 where the central recess 315a is formed may have a further smaller radius of curvature and may be more easily bent.

Figure 10:
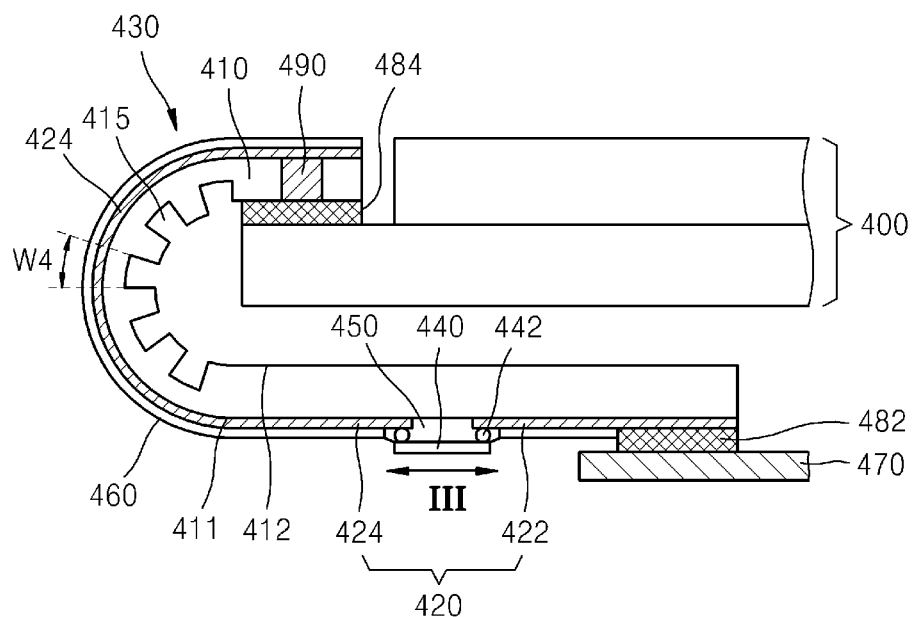
FIG. 10 is a cross-sectional view of a bent chip-on-film package according to an exemplary embodiment of the inventive concept.

FIG. 10 is a cross-sectional view of a bent chip-on-film package according to an exemplary embodiment of the inventive concept.

Referring to FIG. 10, the chip-on-film package may include a tape wiring substrate 430 and a semiconductor chip 440.

The tape wiring substrate 430 may include a base film 410, a wiring pattern 420, a protection film 460, and a via 490.

The base film 410 includes an upper surface 411 and a lower surface 412. The lower surface 412 may contact a display panel. The upper surface 411 may be positioned opposite to the lower surface 412. A plurality of recesses 415 is formed in the lower surface 412 of the base film 410. Each of the recesses 415 is formed substantially parallel to an edge of the base film 410 that is attached to the display panel 400. The recesses 415 may have a fifth width W4 and may be separated from each other by a predetermined distance.

The wiring pattern 420 is formed on the upper surface 411 of the base film 410 and may include an input wiring pattern 422 and an output wiring pattern 424. An end of the input wiring pattern 422 may be connected to a printed circuit board 470, and the other end may be extended to an edge of a chip-mounting region III. An end of the output wiring pattern 424 may be extended to an edge of the base film 410 connected to the display panel 400 and may be connected to the via 490. The other end of the output wiring pattern 424 may be extended to an edge of the chip-mounting region III.

The protection film 460 may cover the wiring pattern 420 on the upper surface 411 of the base film 410. The protection film 460 may cover the entire output wiring pattern 424, may cover a portion of the input wiring pattern 422, and may expose a portion of the input wiring pattern 422.

A plurality of vias 490 may be formed, and the output wiring pattern 424 may be connected to a second connection unit 484 through the via 490. In an exemplary embodiment, the via 490 may be formed by filling via holes (not shown) that penetrate the base film 410 with a conductive paste.

The semiconductor chip 440 may be formed in the chip-mounting region III that is formed on the upper surface 411 of the base film 410. The semiconductor chip 440 may be connected to the input wiring pattern 422 and the output wiring pattern 424 at edges of the chip-mounting region III through an electrode bump 442 formed around edges of an active surface. An underfill 450 may be filled in a space between the base film 410 and the semiconductor chip 440.

The chip-on-film package may be connected to the printed circuit board 470 through a first connection unit 482 and may be connected to the display panel 400 through the second connection unit 484. The first connection unit 482 may connect the input wiring pattern 422 formed on the base film 410 to a first wiring (not shown) formed on the printed circuit board 470. The second connection unit 484 may connect the output wiring pattern 424 formed on the base film 410 to a gate line or a data line formed on the display panel 400 through the via 490. In an exemplary embodiment, the first connection unit 482 and the second connection unit 484 may respectively be formed using an anisotropic conductive film.

The chip-on-film package connected to the printed circuit board 470 and the display panel 400 may be bent in a direction parallel to an edge of the display panel 400 by exploiting the flexibility of the base film 410, and thus, the printed circuit board 470 and the semiconductor chip 440 on the chip-on-film package may be positioned on a lower side of the display panel 400. Since the recesses 415 are formed in the lower surface 412 of the base film 410, the base film 410 may be bent with the recesses 415 being in an inner side of the base film 410.

According to an exemplary embodiment, the base film 410 in which the recesses 415 are formed has a small thickness, and thus, the repulsion force for the base film 410 to return to an original shape is reduced and stress that may occur in the wiring pattern 420 may be distributed. Accordingly, the reduction of a connection strength at the second connection unit 484 may be prevented. Also, the base film 410 in which the recesses 115 are formed may have a relatively small radius of curvature and may be readily bent. Therefore, the manufacture of a thin display device that uses the above display module may be simplified.

Figure 11:
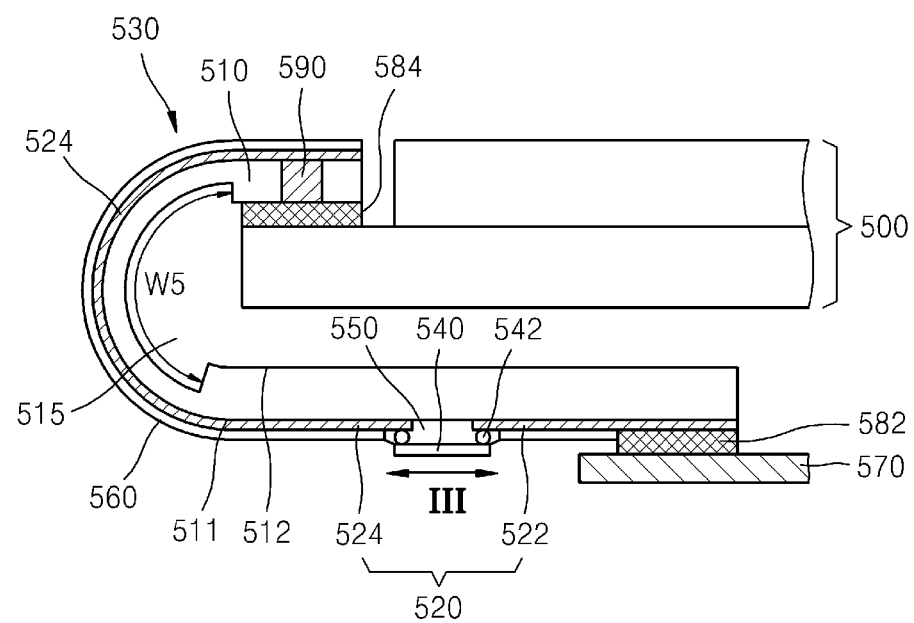
FIG. 11 is a cross-sectional view of a bent chip-on-film package according to an exemplary embodiment of the inventive concept.

FIG. 11 is a cross-sectional view of a bent chip-on-film package according to an exemplary embodiment of the inventive concept. The chip-on-film package may be substantially the same as the chip-on-film package described above with reference to FIG. 10 except the shape of a recess 515 formed in a tape wiring substrate 530. Accordingly, the description of FIG. 11 may be limited to the differences between the bent chip-on-film packages of FIG. 11 and FIG. 10 and it may be assumed that those features not described are similar to or identical to corresponding features of FIG. 10.

Referring to FIG. 11, a base film 510 may include a wiring pattern 520 on an upper surface 511 of the base film 510 and the recess 515 in a lower surface 512. A semiconductor chip 540 may be formed in a chip-mounting region III formed on the upper surface 511 of the base film 510. An input wiring pattern 522 on the base film 510 may be connected to a printed circuit board 570 through a first connection unit 582, and an output wiring pattern 524 on the base film 510 may be connected to a display panel 500 through a second connection unit 584.

The recess 515 is formed in the lower surface 512 of the base film 510 having a sixth width W5. The sixth width W5 of the recess 515 may be larger than the depth of the recess 515. The sixth width W5 of the recess 515 may be formed to correspond to a length of a bending portion of the base film 510.

The base film 510 is bent with the recess 515 being at an inner side of the base film 510. Accordingly, repulsion force for the base film 510 to return to an original flat shape of the base film 510 may be reduced, and thus, stress that may occur in the wiring pattern 520 may be distributed. Accordingly, the reduction of connection strength of the second connection unit 284 and wire disconnection may be prevented. Also, the base film 510 in which the recess 215 is formed may have a small radius of curvature and may be relatively easy to bend. Therefore, the manufacture of a thin display device that uses the above display module may be simplified.

Figure 12:
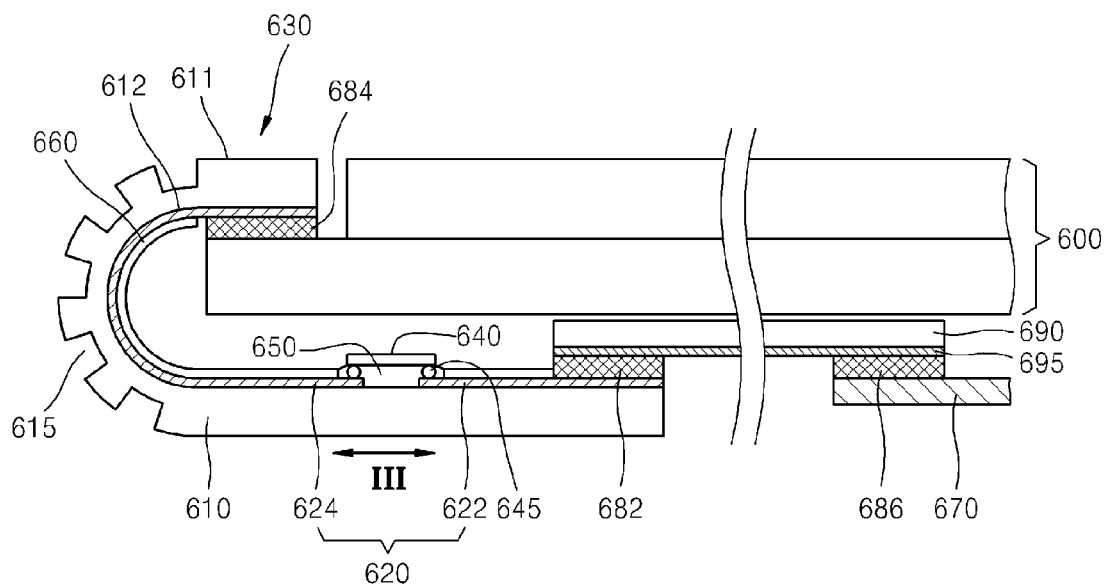
FIG. 12 is a cross-sectional view of a bent chip-on-film package according to an exemplary embodiment of the inventive concept.

FIG. 12 is a cross-sectional view of a bent chip-on-film package according to an exemplary embodiment of the inventive concept. The chip-on-film package is substantially the same as the chip-on-film package described with reference to FIGS. 2 and 3 except that the chip-on-film package of FIG. 12 further includes a flexible printed circuit (FPC) film 690. Accordingly, the discussion of FIG. 12 will be limited to differences between the arrangement shown here and that of FIGS. 2 and 3 and it may be assumed that features not discussed may be similar to or identical to corresponding features of FIGS. 2 and 3.

Referring to FIG. 12, the chip-on-film package may include a wiring substrate 630 including a semiconductor chip 640 and the FPC film 690.

A base film 610 may include a plurality of recesses 615 in an upper surface 611 and a wiring pattern 620 on a lower surface 612. The semiconductor chip 640 may be included in a chip-mounting region III formed on the lower surface 612 of the base film 610.

An input wiring pattern 622 on the base film 610 may be connected to a second wiring pattern 695 on the FPC film 690 through a first connection unit 682, and an output wiring pattern 624 on the base film 610 may be connected to a display panel 600 through a second connection unit 684.

The FPC film 690 may have insulating properties, may be flexible, and may be formed of, for example, a resin film, such as polyimide.

The second wiring pattern 695 may be formed on a surface of the FPC film 690. An end of the second wiring pattern 695 may be connected to the input wiring pattern 622 on the base film 610 through the first connection unit 682, and the other end of the second wiring pattern 695 may be connected to a first wiring (not shown) of a printed circuit board 670 through a third connection unit 686. According to an exemplary embodiment, the second wiring pattern 695 may be formed of an electrically conductive material, such as an oxide of Cu, Al, Ti, or Sn.

In an exemplary embodiment, both ends of the second wiring pattern 695 may have different pitches. When the wiring pattern 620, the first wiring, and the second wiring have a predetermined width and include a plurality of conductive lines arranged with predetermined gaps, the sum of the width and gap of the single conductive line is referred to as a pitch. According to an exemplary embodiment, the pitch of the input wiring pattern 622 on the base film 610 may be smaller than that of the first wiring on the printed circuit board 670. In a display device, as the size of a unit pixel is reduced and resolution is increased, gate lines or data lines formed on the same area of the display panel 600 may be increased, and accordingly, the pitch of the input wiring pattern 622 connected to the gate lines or the data lines may be reduced. The pitch of the first wiring formed on the printed circuit board 670 may be greater than that of the output wiring pattern 624. Accordingly, an end of the second wiring pattern 695 on the FPC film 690 may be formed having the same pitch as the output wiring pattern 624. The other end of the second wiring pattern 695 may be formed having the same pitch as the first wiring. The pitch of the second wiring pattern 695 may be changed at a central portion of the FPC film 690.

In an exemplary embodiment, the FPC film 690 may be bent to a predetermined radius of curvature. In this case, at least one recess (not shown) may be formed in a surface of the FPC film 690, and thus, the FPC film 690 may be with the recess in an inner side or outer side of the FPC film 690.

While the inventive concept has been particularly shown and described with reference to exemplary embodiments thereof, it will be understood that various changes in form and details may be made therein without departing from the spirit and scope thereof.

What is claimed is:

1. A tape wiring substrate comprising: a base film having a first surface and a second surface opposite the first surface, wherein the first surface comprises at least one recess and the second surface comprises a chip-mounting region on which a semiconductor chip is mounted; a wiring pattern formed on the second surface of the base film, wherein the wiring pattern is extended to an edge of the chip-mounting region; and a protection film covering the wiring pattern, wherein the wiring pattern comprises an input wiring pattern and an output wiring pattern, wherein a first end of the input wiring pattern is extended to an edge of the chip-mounting region, a second end of the input wiring pattern is extended to a first end of the base film, a first end of the output wiring pattern is extended to an edge of the chip-mounting region, and a second end of the output wiring pattern is extended to a second end of the base film.

2. The tape wiring substrate of claim 1, wherein the at least one recess comprises a plurality of recesses each of which having substantially the same width, and being separated from each other by predetermined distances.

3. The tape wiring substrate of claim 1, wherein the at least one recess comprises a plurality of recesses each of which having substantially the same width, and being separated by different distances.

4. The tape wiring substrate of claim 1, wherein the at least one recess comprises a plurality of recesses each of which having a different width, and being separated by predetermined distances.

5. The tape wiring substrate of claim 1, wherein the at least one recess comprises only a single recess having a width substantially greater than its depth.

6. The tape wiring substrate of claim 1, wherein the at least one recess comprises a plurality of recesses each having different depths, and separated by predetermined distances from each other.

7. A chip-on-film package comprising: a tape wiring substrate that comprises: a base film having a first surface and a second surface opposite the first surface, wherein the first surface comprises at least one recess and the second surface comprises a chip-mounting region on which a semiconductor chip is mounted; a wiring pattern formed on the second surface of the base film, wherein the wiring pattern is extended to an edge of the chip-mounting region and comprises an input wiring pattern and an output wiring pattern; and a protection film covering the wiring pattern; and a semiconductor chip connected to the input wiring pattern and the output wiring pattern through one or more electrode bumps formed on an active surface of the semiconductor chip, the semiconductor chip mounted on the chip-mounting region of the base film, wherein the input wiring pattern is connected to a printed circuit board and the output wiring pattern is connected to a display panel, wherein an end of the output wiring pattern is connected to an upper surface of the display panel through a via that penetrates the base film.

8. The chip-on-film package of claim 7, wherein an end of the output wiring pattern is connected to an upper surface of the display panel.

9. The chip-on-film package of claim 7, wherein the base film is bent to have an inner side and an outer side and the at least one recess is formed in the inner side of the base film.

10. The chip-on-film package of claim 7, further comprising:
   a flexible printed circuit (FPC) film; and
   a second wiring pattern formed on the FPC film, wherein
      a first end of the second wiring pattern is connected to the input wiring pattern and a second end of the second wiring pattern is connected to the printed circuit board.

11. The chip-on-film package of claim 7, wherein the base film comprises a plurality of recesses formed using a polyimide etching process or a laser etching process.

12. The chip-on-film package of claim 7, wherein the output wiring pattern is connected to a flexible panel of an organic light-emitting display device or a liquid crystal display device.

13. A display device, comprising: a display panel; a flexible tape wiring substrate having one or more recesses formed thereon, the flexible tape wiring substrate connected to a top surface of the display panel; and a semiconductor chip mounted on the flexible tape wiring substrate, wherein the flexible tape wiring substrate is bent such that the semiconductor chip mounted thereon is positioned underneath a bottom surface of the display panel, wherein the one or more recesses comprise a plurality of recesses of identical widths and identical spacing, of identical widths and varying spacing, of varying widths and identical spacing, or of varying widths and varying spacing.

14. The display device of claim 13, wherein the flexible tape wiring substrate comprises:
   a base film;
   a wiring pattern formed over the base film; and
   a protective film formed over the wiring pattern.

15. The display device of claim 13, wherein the one or more recesses comprises only a single recess having a width that is substantially greater than its depth.

16. The display device of claim 13, wherein the semiconductor chip comprises a display driver for driving the display panel.

* * * * *